United States Patent [19]
Hobi

[11] Patent Number: 4,868,731
[45] Date of Patent: Sep. 19, 1989

[54] GATE CONTROL CIRCUIT FOR A GTO THYRISTOR

[75] Inventor: Günther Hobi, Fehraltorf, Switzerland

[73] Assignee: Zellweger Uster AG, Uster, Switzerland

[21] Appl. No.: 281,079

[22] Filed: Dec. 8, 1988

[30] Foreign Application Priority Data

Dec. 8, 1987 [CH] Switzerland .......................... 04794/87

[51] Int. Cl.$^4$ ........................................... H02M 7/155
[52] U.S. Cl. ........................................ 363/54; 363/57; 363/85; 363/96; 307/633
[58] Field of Search ...................... 363/54, 57, 58, 85, 363/96, 128–129, 135–138; 307/270, 631, 633

[56] References Cited

U.S. PATENT DOCUMENTS

| | | | |
|---|---|---|---|
| 3,541,433 | 11/1970 | Davis | 323/320 |
| 3,646,400 | 2/1972 | Demarest et al. | 361/382 |
| 3,676,745 | 7/1972 | Traweek | 361/388 |
| 3,833,886 | 9/1974 | Baumann | 340/167 |
| 3,967,264 | 6/1976 | Whyte et al. | 340/310 |
| 4,139,737 | 2/1979 | Shimada et al. | 179/15 |
| 4,185,272 | 1/1980 | Feiker | 340/168 |
| 4,200,862 | 4/1980 | Campbell et al. | 340/310 |
| 4,231,083 | 10/1980 | Matsuda et al. | 363/57 |
| 4,336,568 | 6/1982 | Mitchell | 361/386 |
| 4,418,333 | 11/1983 | Schwarzbach et al. | 340/310 |
| 4,446,462 | 5/1984 | Ouellette et al. | 340/825.07 |
| 4,593,204 | 6/1986 | McMurray | 307/633 |
| 4,597,038 | 6/1986 | Stacey | 307/633 |
| 4,599,598 | 7/1986 | Komoda et al. | 340/310 |
| 4,618,817 | 10/1986 | Holtslander | 323/322 |
| 4,638,299 | 1/1987 | Campbell | 340/310 |
| 4,682,278 | 7/1987 | Marquardt et al. | 363/58 |
| 4,714,912 | 12/1987 | Roberts et al. | 340/310 |
| 4,794,509 | 12/1988 | Nussbaumer | 363/141 |

FOREIGN PATENT DOCUMENTS 1514450 10/1969 Fed. Rep. of Germany .

OTHER PUBLICATIONS

A Title Page, Table of Contents and Chapter Five of the Book, "Principles of Inverter Circuits" by B. D. Bedford & R. G. Hoft.
A title page and table of contents of the Siemens Book, "Selbstgefuhrte Thyristor–Stromrichter" by M. Meyer.
"Zellweger Impulse", (Zellweger Pulses), No. 3, Nov., 1971.
IBM Technical Disclosure Bulletin, vol. 22, No. 2, Jul., 1979.
"GTO–Gate–Circuit", Hitachi, Instruction Manual for Gate Circuit of Discrete Power Supply System.
"Praxis mit dem GTO", Ludwig et al.
The article, "DECABIT: The New Electronic Zellweger Ripple Control System".

Primary Examiner—Peter S. Wong
Attorney, Agent, or Firm—Burns, Doane, Swecker & Mathis

[57] ABSTRACT

The circuit contains a separate firing and extinguishing circuit, each having a respective capacitive charge store for generating the firing and the extinguishing current pulses for a GTO thyristor. A fast switching element which can be directly activated via a push-pull stage is provided which, when activated, discharges a respective charge store via the gate-cathode path of the GTO thyristor. As a result, the GTO thyristor can be operated at a high cycle frequency of up to at least 12,000 Hz and can be used in audio frequency transmitters for ripple control systems.

19 Claims, 5 Drawing Sheets

GATE CONTROL CIRCUIT FOR A GTO THYRISTOR

BACKGROUND OF THE INVENTION

The present invention is the field of ripple control. It is known that this is a system for transmitting switching commands via the existing distribution systems of the electrical supply which makes it possible to influence the system load directly from a central point in the case of load peaks or production bottlenecks.

The transmitter which transmits the audio-frequency switching signals into the system to be controlled assumes a central position in a ripple control system. A command device transmits to the ripple control transmitter the bit pattern of the required transmission and the transmitter converts this pattern into a signal with the appropriate ripple control frequency which is fed into the system through a coupling arrangement. Each connected ripple control receiver receives the signal, decodes it and appropriately switches a particular connected load.

For purposes of considering its operation, the ripple control transmitter can be divided into a control section and a power section. The control section contains all circuits required for control and supervision, while the power section contains, among other things, a control and measurement converter, a rectifier, an inverter and an output section. Reference input variables trigger in the control section control signals which generate a load voltage having the required ripple control frequency from a rectified voltage in the inverter branches in the power section.

The power section has hitherto been implemented in the form of conventional thyristor converters or, even earlier, as a motor converter. From the ample literature in this field, the following should be mentioned here by way of example: M. Meyer "Self-commutated thyristor inverters", Siemens reference book, 3rd edition 1974; B. D. Bedford, R. G. Hoft "Principles of Inverter Circuits", John Wiley, New York 1964.

Motor converters are expensive and require intensive servicing and are subject to a mechanical wear phenomena. In addition, their frequency is generally not constant. They require a longer start-up phase and produce noise and vibrations.

Conventional thyristor converters require complicated commutation devices since the thyristors cannot be turned off via the gate electrode. Such commutating devices are expensive, voluminous and heavy and must be designed for a narrow-band frequency. The required reactor coils produce noise and the commutation only operates within a limited range of load angles. In addition, the efficiency is highly frequency- and load-dependent and, as a rule, is less than 85%.

For some years, higher-power turn-off thyristors, so-called GTO thyristors (GTO=Gate Turn-Off) have been available for use in current converters as a result of which the elaborate commutation elements are no longer needed in the inverter section of the current converter. They are replaced by a thyristor turn-on and -off device (gate driver) by means of which the thyristors can be turned on and off via the gate. This increases, on the one hand, the efficiency and, on the other hand, the system becomes virtually noiseless, independent of load angle, free in the frequency range, smaller and lighter.

Previous main fields of application of GTO thyristors are converters for industrial drives and control systems, inverters in auxiliary current supply systems for rail and road traffic, inverters for three-phase drives for rail vehicles and uninterruptable power supply systems. In the application for motor drives, the cycle frequency range needed is usually some 100 Hz; previous gate drivers are operated at a frequency of about 3000 Hz at a maximum.

However, ripple control transmitters require a much higher frequency range since they must cover a frequency range of approximately 100–2000 Hz. By using 6-pulse inverter circuits with an inverter output current, the current/time integral of each phase of which is equal to zero for each transmitting current period, the sum of all three output currents also being equal to zero at any time, a cycle frequency corresponding to six times the ripple control frequency is needed. For a 2000 Hz ripple control frequency, this means a cycle frequency of 12000 Hz for the GTO thyristor and the gate driver which is a multiple of the previously possible maximum frequency.

SUMMARY OF THE INVENTION

The invention relates to a gate control circuit for a GTO thyristor which can be operated at high cycle frequencies, with a separate firing and extinguishing circuit.

This gate control circuit, the principle of which is known from the references "Praxis mit dem GTO" (practical experience with the GTO) by W. Bosterling, H. Ludwig, R. Schimmer, M. Tscharn, reprint from "Elektrotechnik" 64 and 65, number 24, December 1982, pages 16–21 and number 4, February 1983, pages 14–17; and "GTO-Gate-Circuit", Hitachi, Instruction Manual for Gate Circuit of Discrete Power Supply Systems, Apr. 12, 1982, should need the following requirements for use in ripple control transmitters:

Provide the possibility of a cycle frequency of up to at least 12000 Hz.

Deliver the special current and voltage characteristics required by GTO thyristors.

Provide the possibility of fast turn-on and/or turn-off in emergency situations (Signal propagation times in the range of approximately 2 us and power reserves for turn-on and/or turn-off current pulses).

Provide the possibility of electrical isolation between control logic and power supply.

According to the invention, the set object is achieved by the fact that a separate capacitive charge store is provided for generating each of the firing and extinguishing current pulses and that the circuit contains a fast switching element which can be directly activated via a push-pull stage and which, when activated, discharges the respective charge store via the gate-cathode path of the GTO thyristor.

The use, in accordance with the invention, of the two charge stores for generating the firing and the extinguishing current pulses and of the fast switching element which discharges the charge stores via the gate-cathode path of the GTO thyristor renders possible the required high cycle frequency and the fast turn-on and/or turn-off in the case of emergency situations. Similarly, the required current and voltage characteristics and the electrical isolation between control logic and power supply are ensured.

BRIEF DESCRIPTION OF THE DRAWINGS

In the text which follows, the invention is explained in greater detail with reference to an illustrative embodiment shown in the drawings, in which.

DETAILED DESCRIPTION OF THE INVENTION

Figure 1:
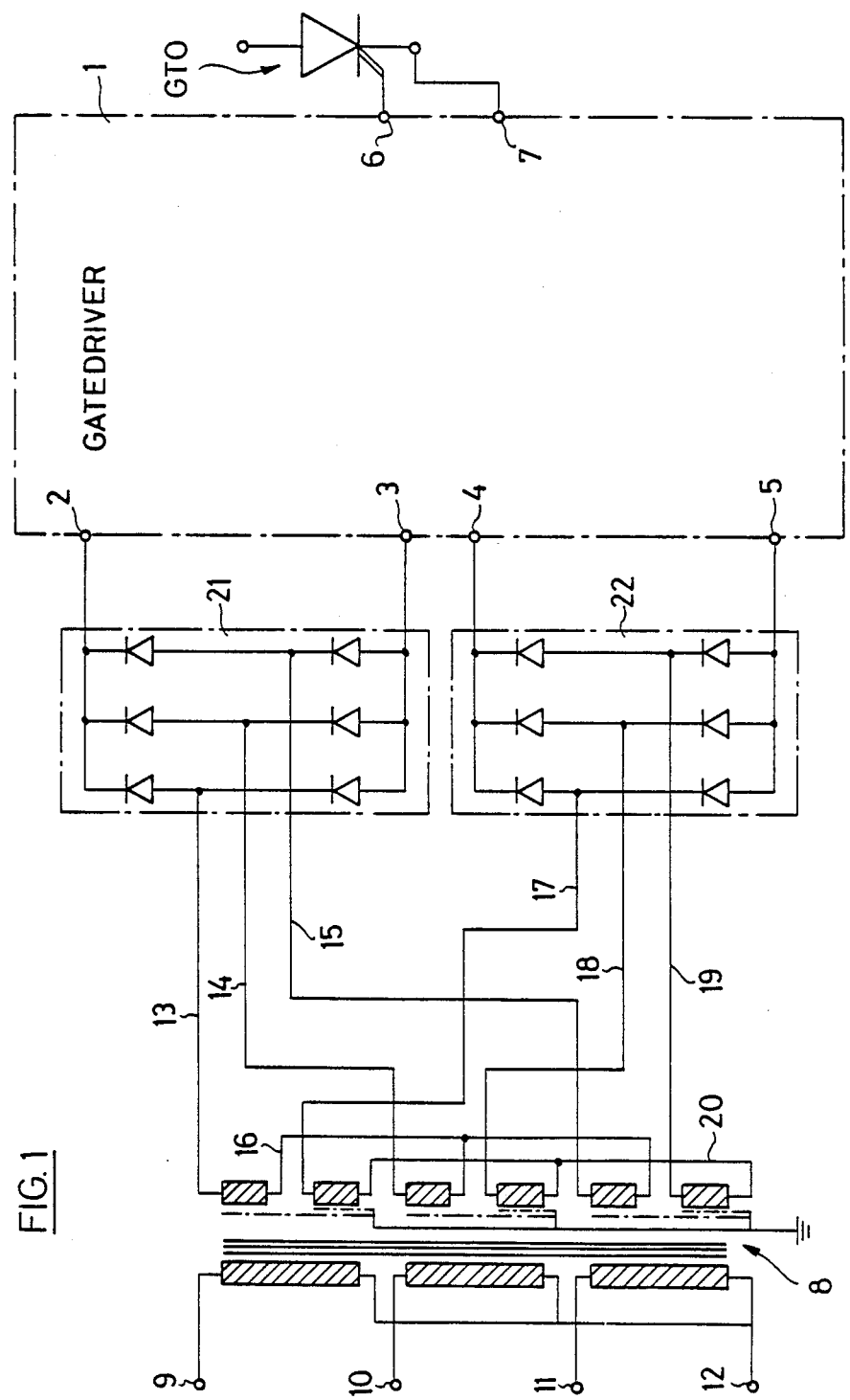
FIG. 1 shows a block diagram of the control circuit of a GTO thyristor.

The block diagram of FIG. 1 shows the circuit for a GTO thyristor, GTO which essentially consists of a power supply section and of a gate driver circuit (gate driver). According to the illustration, the gate driver, designated by the reference number 1, exhibits six connections, two connections 2 and 3 for the firing direct voltage, two connections 4 and 5 for the extinguishing direct voltage, a connection 6 to the gate electrode and a connection 7 to the cathode of the GTO thyristor, GTO. The feed transformer of the gate driver 1 is designated by 8. It includes four connections on the primary side, one system connection 9 to 11 for each of the three phases and a system connection 12 for the neutral conductor.

From the secondary side of the feed transformer 8, three connections 13, 14 and 15 are tapped off for the three phases and a connection 16 for the neutral point of the firing alternating voltage and three connections 17, 18 and 19 for the three phases and a connection 20 for the neutral point of the extinguishing alternating voltage. Connections 13 to 15 for the three phases of the firing alternating voltage and connections 17 to 19 of the extinguishing alternating voltage are each connected to a six-pulse three-phase rectifier bridge 21, 22 for the firing and for the extinguishing voltage, respectively. At the outputs of the rectifier bridge 21 for the firing voltage, the unsmoothed firing direct voltage (connections 2 and 3 of the gate driver) is present and at the outputs of the rectifier bridge 22 for the extinguishing voltage the unsmoothed extinguishing direct voltage (connections 4 and 5 of the gate driver) is present.

The gate driver 1, which must be considered to be part of the control section of the ripple control transmitter, contains a microprocessor system which calculates the correct firing and extinguishing sequence of the GTO thyristor for any instant. The control signals of the microprocessor system are converted into optical signals and forwarded via optical conductors L (FIG. 2) to the gate driver which includes a corresponding receiver E for the optical signals of the optical conductors L. The gate driver 1 converts the optical signals into electrical signals and provides the required control voltages and control currents to the GTO thyristor at the correct time so that the GTO thyristor can fulfill its function as a high-power semiconductor switch.

Figure 2:
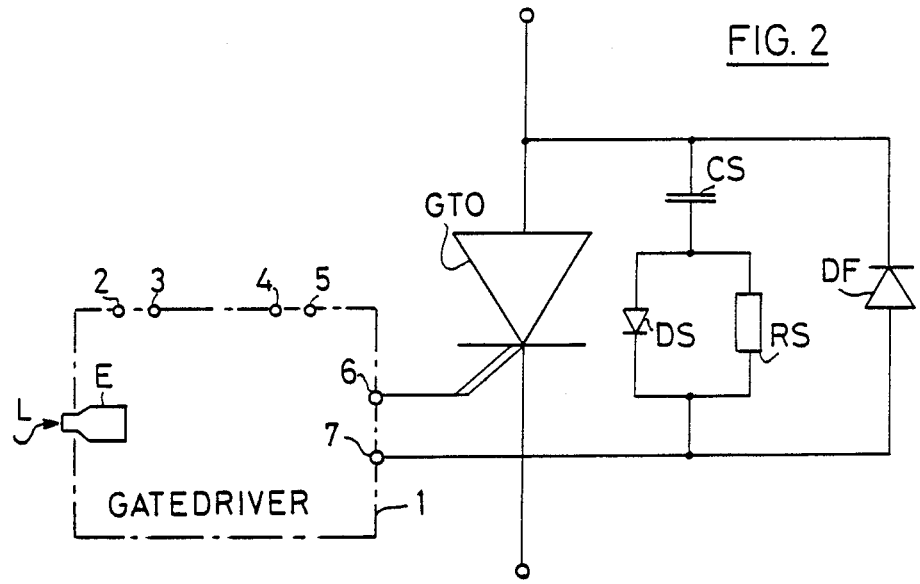
FIG. 2 shows a block diagram of the protection circuit for a GTO thyristor.

For each ripple control transmitter, six GTO modules are provided each of which contains a GTO thyristor plus gate driver according to FIG. 2. These six GTO thyristors are arranged in the form of three pairs and are controlled by the firing sequences in such a manner that the nodal voltages, that is in each case the output voltage of a GTO pair picked up between the two GTO thyristors, correspond to a predetermined pattern. From these nodal voltages, chained output voltages having a step-like characteristic are formed which generates step-like phase voltages across a resistive load.

If these step-like phase voltages generated by the GTO thyristors and activated by means of the gate drivers are applied to the high-voltage coupling, the step-like voltages are filtered and superimposed on the 50-Hertz system frequency as a sinusoidal voltage with the set ripple control frequency. In accordance with the input keying signal, the transmitter superimposes the audio frequency on the system voltage in the form of a bit pattern and a so-called message is produced which consists, for example in the known DECABIT command (DECABIT is the registered trademark of Zellweger Uster AG) of 11 time units, a start pulse, five other pulses and five pulse gaps. An entire ripple control transmission can then consist of an arbitrary number of messages.

In general, a GTO thyristor cannot be operated by means of a gate driver alone but in practical application requires a protective circuit of the type shown in FIG. 2. Such protective circuits are called snubbers in the literature and generally consist of an RCD (i.e., resistor-capacitor-diode) section, RS, CS, DS. In the case of asymmetrically blocking GTO thyristors, an anti-parallel freewheeling diode DF is also required in addition to this protective circuit.

When the GTO thyristor is in its blocking state, the capacitor CS is charged up to the full block voltage of the thyristor. When a firing pulse is present at the gate electrode of the GTO thyristor, its anode-cathode path becomes conductive and the capacitor CS discharges via the resistor RS with the time constant typical of this combination. If an extinguishing pulse then occurs during this discharge time, the remaining voltage can again fire the GTO thyristor "overhead" via the capacitor CS, following the extinguishing pulse. During this process, the power dissipation in the semiconductor chip of the GTO thyristor can destroy the thyristor. This risk of destruction of the GTO thyristor by unwanted retriggering of the semiconductor is prevented by a latching of the extinguishing pulse for the duration of a multiple of the discharge time constant of the capacitor CS, that is to say during the firing pulse duration at the gate driver (see FIG. 6).

Due to the construction and the structure of the semiconductor chip, many individual crystal domains must be switched to the blocking state in order to extinguish the GTO thyristor when the GTO thyristor is in the conducting state and an extinguishing pulse occurs. During the turn-off process, a very high power dissipation occurs for a short time, and thus heat is generated which must be conducted away from the GTO thyristor.

Figure 7:
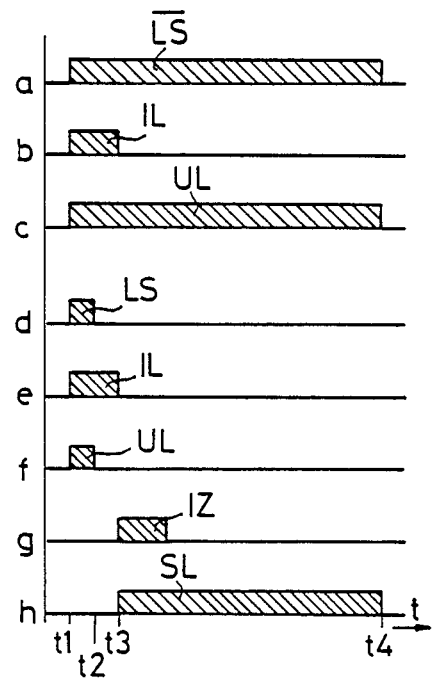

If during this turn-off phase, a retriggering occurs due to a firing pulse on the gate control line or due to an "overhead firing", additional charge carriers are injected into the semiconductor as a result of which the power dissipation rises further. This can lead to local overheating of the semiconductor and thus to the destruction of the GTO thyristor. To avoid this undesirable operating condition, therefore, any firing pulse present must be blocked until the extinguishing process is concluded; the GTO thyristor can only be retriggered after that. The signal time characteristic of this firing pulse lock-out is shown in FIG. 7.

Figure 3:
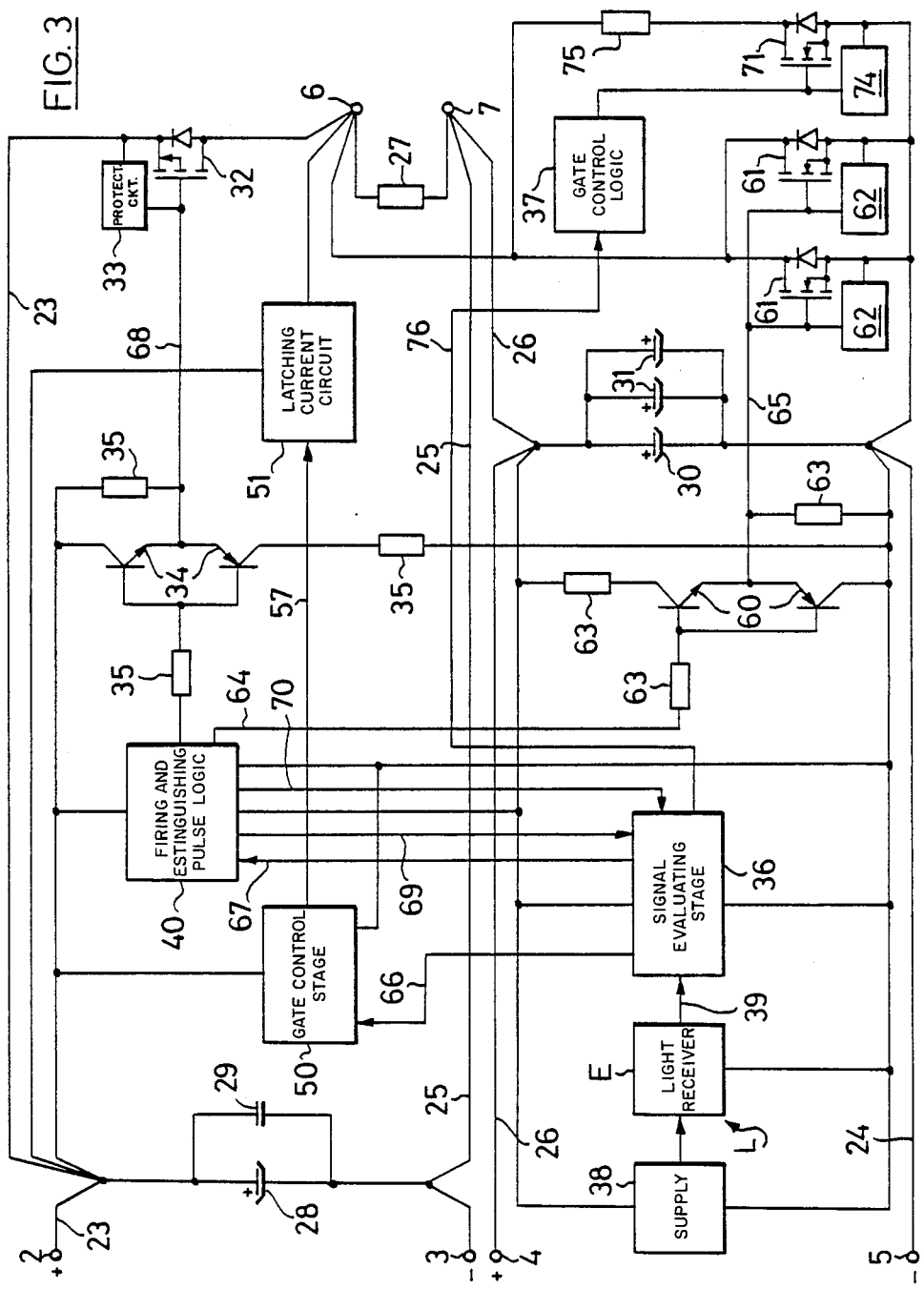
FIGS. 3-5 each show a block diagram of the gate driver of circuit of FIG. 1.
Figure 4:
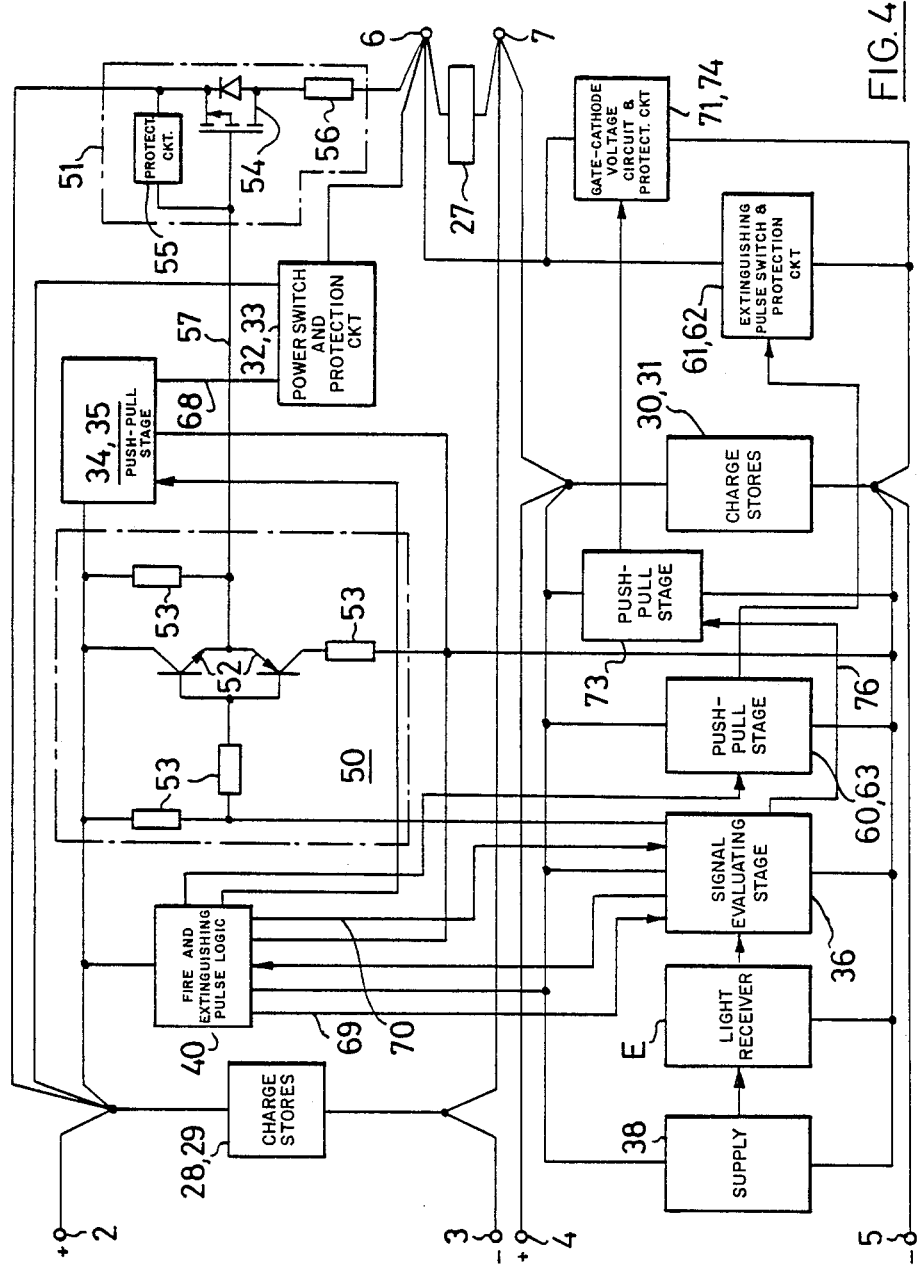
Figure 5:
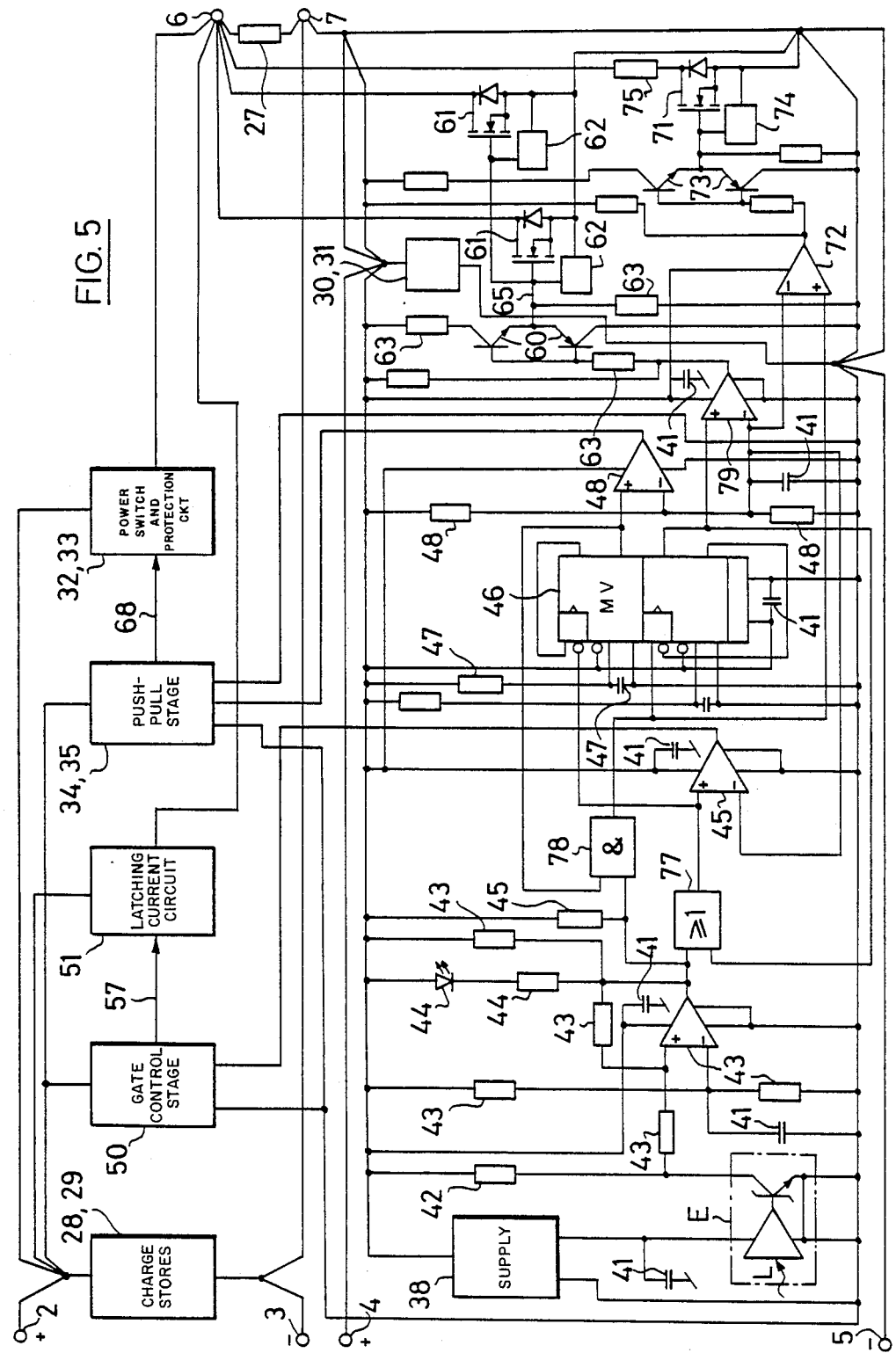

The gate driver 1 is shown in a block diagram in FIGS. 3–5, each of these block diagrams in each case showing the entire gate driver, but the degree of detailing of individual components being different in the individual figures. According to FIG. 3, a positive bus bar 23 is connected from connection 2 via a FET switch 32 and a negative bus bar 24 is connected from connection 5 via a FET switch 61 to connection 6 and to the gate electrode of the GTO thyristor. Negative and positive bus bars 25 and 26, respectively, are connected from each of the connections 3 and 4, respectively to connection 7 and to the cathode of the GTO thyristor. A gate driver terminating element 27 is provided between the two connections 6 and 7 to the GTO thyristor.

In the circuit for the firing direct voltage (positive and negative bus bars 23 and 25, respectively) branching away from connections 2 and 3, two firing charge stores 28 and 29, formed by capacitors, are arranged of which the firing charge store 28 is used as energy store for the firing pulse and the firing charge store 29 is used as energy store for a steep current edge slope. Analogously, one to three charge stores 30, 31 for the extinguishing current pulse and for a steep current edge slope are arranged in the circuit for the extinguishing direct voltage (positive and negative bus bar 26 and 24, respectively) branching away from the connections 4 and 5. The number of these charge stores is dependent on the power capacity of the GTO thyristor.

The firing pulse for the GTO thyristor is triggered by the power FET switch (P-channel FET) 32 which includes a corresponding protective circuit 33 and which is controlled by a push-pull stage 34 with connected element 35. The push-pull stage 34 is controlled by a firing and extinguishing pulse logic 40 which, in turn, is connected to a signal evaluating stage 36. The firing and extinguishing pulse logic 40 is shown in greater detail in FIG. 5. The signal evaluating stage 36 is controlled by the aforementioned light receiver E which is fed by a supply 38 and exhibits the optical conductor connection L.

The optical conductor connection L formed by fiber optics is connected to a central control stage (not shown) for processing the commands and signals input into the ripple control transmitter, which conducts control pulses corresponding to these data via the optical conductor connection L to the optical receiver E. The latter delivers corresponding electrical control signals to the signal evaluating stage 36 via a line 39.

The optical receiver E evaluates the optical information of the fiber optics connection L in such a manner that a signal change from no light to light triggers a firing pulse which is followed by an addition of the so-called latching current, and that a signal change from light to no light (extinguishing of the light) triggers an extinguishing pulse. Subsequent to the extinguishing pulse, the negative gate-cathode voltage is built up. In this connection, latching current means the gate control current which holds the GTO thyristor in the turned-on state even if the load current drops below the holding current of the GTO thyristor. The latching current could therefore appropriately be called the control holding current.

As has already been mentioned, the circuit of the gate driver exhibits as an additional function a firing pulse lock-out function the time characteristic of which is shown in FIG. 7, normal operation being shown in lines a–c of FIG. 7, and fault operation being shown in lines d–h.

If in normal operation the optical signal LS applied to the optical receiver E changes from light to no light at time t1 (the signal LS barred, which is complementary to LS, that is to say no light, is drawn in line a), an extinguishing pulse IL is generated (line b) and an extinguishing voltage UL is built up between gate and cathode 6 and 7, respectively (line c) until the optical signal changes back from no light to light at time t4 as a result of which the GTO thyristor is fired.

If the change from no light to light, and thus the firing pulse, already occurs at time t2, that is to say at a time at which the GTO thyristor should be cut off (line d), the extinguishing voltage UL would disappear (line f) and when the extinguishing pulse IL (line e) disappears at time t3, a firing pulse IZ (line g) would be generated and, at the same time, the latching current SL (line h) would be added and the GTO thyristor would not retrigger before the extinguishing process has been concluded.

The locking out of the firing pulse IZ (line g) must obey the following logical relationship: a firing pulse must become effective only if no further optical signal LS and no extinguishing pulse IL are present. According to the Boolean conversion, this results in the following formula which can be applied in practice:

$$IZ \text{ barred} = LS + IL \quad \text{(Formula 1)}$$

The practical implementation of this function will be described later.

The signal evaluating stage 36 delivers its signals to the firing and extinguishing pulse logic 40, to a gate control stage 50 for the latching current and to a gate control stage 37 for the gate-cathode blocking voltage, which essentially consists of a signal logic and a push-pull stage 73 connected to a gate-cathode voltage circuit 71, 74. The gate control stage 50, which essentially includes a signal logic and a push-pull stage connected to the latching current switch, is shown in greater detail in FIG. 4.

As can be seen in FIG. 3, three connecting lines exist between the signal evaluating stage 36 and the firing and extinguishing pulse logic 40: a line 67 for the firing pulse, a line 69 for locking out the firing pulse, and a line 70 for locking out the extinguish pulse. A further output of the logic 40 is connected via a line 64 for the extinguishing pulse control signal to a push-pull stage 60 for the extinguishing pulse switch 61. The latter is a power FET switch (N-channel FET) for the extinguishing current pulse and includes an appropriate protective circuit 62. The element connected to the push-pull stage 60 is designated by the reference number 63.

The turn-off characteristics of a GTO thyristor are very greatly dependent, among other things, on the voltage rise dU/dt of the anode-cathode voltage which builds up again. The turn-off current is directly related to the rise dU/dt of the voltage which has been applied again; this shows that the response of the GTO thyristor is highly dependent on the voltage rise occurring after an extinguishing pulse. For this reason, measures must be taken for checking the rate of rise of the voltage which has been applied again.

The dU/dt characteristic can be significantly improved, on the one hand, by a compact configuration, particularly of the protective RCD circuit (FIG. 2) and, on the other hand, by using a negative gate voltage during the anode current trail time. The latter means that the negative gate-cathode voltage should be maintained following the turn-off during the entire time of the GTO cut-off phase or up to the next firing pulse. In the gate driver shown, this object is achieved by activating a comparator 72, the push-pull stage 73 and the gate-cathode voltage switch 71 (FIG. 5). The latter is a power FET switch and its protective circuit is designated by 74. The circuit for the push-pull stage 73, which is not provided with reference numbers for space reasons, corresponds to that of the push-pull stage 60. Reference number 75 designates a resistor which, together with the gate-cathode terminating resistor 27, forms a voltage divider for the build-up of the negative gate-cathode blocking voltage. Resistor 75 is also used for limiting the short-circuit current in case of a short circuit at the output terminals 6, 7 of the gate driver.

Figure 6:
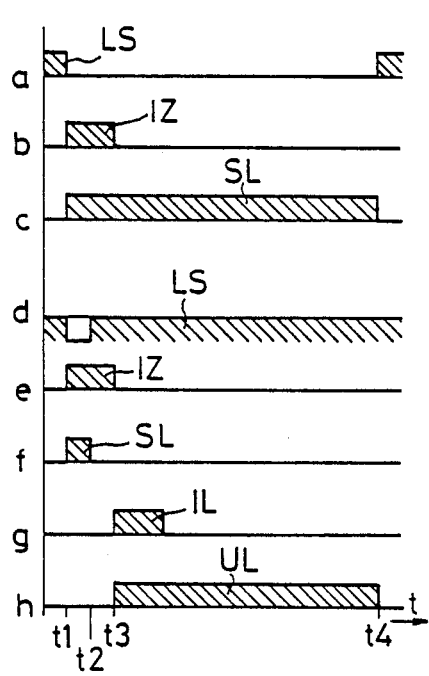
FIGS. 6-7 show diagrams for explaining the operation of the invention.

As has already been mentioned, the gate driver contains, as a further additional function, an extinguishing pulse lock-out the time characteristic of which is shown in FIG. 6. FIG. 6 does not need to be explained in greater detail here because of the analogy between FIGS. 6-7. It need only be pointed out that the optical signal LS is drawn in line a, a firing pulse IZ in line b and the latching current SL in line c (in each case for normal operation). In the remaining lines relating to fault operation, the optical signal LS is drawn in line d, a firing pulse IZ in line e, the latching current SL in line f, an extinguish pulse IL in line g and the gate/cathode extinguish voltage in line h. Time t is plotted along the abscissa, where t1 designates the instant of firing, t3 the instant of extinguishing and t2 the time of occurrence of an unwanted extinguishing pulse.

FIG. 6 immediately shows that the following logical relation must exist for an extinguishing pulse lock-out: an extinguishing pulse IL must occur only when no further firing pulse IZ, or, in other words, when a negated firing pulse IZ barred, is present, and when the optical signal LS has assumed the logical "1" state, that is to say no light is applied. Written as a formula, this means:

$$IL = IZ \text{ barred} \times LS \quad \text{(Formula 2)}$$

The practical implementation of this function will be described later.

The firing and extinguishing pulse logic 40 supplies the control signal for the extinguishing pulse via a line 64 to the push-pull stage 60 which, in turn, delivers the control signal for the extinguishing pulse switch 61 via a line 65. Via a line, designated by 66, between signal evaluating stage 36 and gate control stage 50, the latter receives the control signal for the latching current and the firing and extinguishing pulse logic 40 receives the control signal for the firing pulse via the line 67. From the gate control stage 50, a line, designated by 57, with the control signal for the latching current switch leads to a latching current circuit 51 which is shown in greater detail in FIG. 4. The control signal for the firing pulse switch 32 is delivered by the push-pull stage 34 via a line 68.

The signal evaluating stage 36 supplies the control signal for the gate-cathode blocking voltage via a line 76 to the gate control stage 37 (FIG. 3) and thus to the push-pull stage 73 which, in turn, controls the gate-cathode voltage switch 71.

FIG. 4 shows a block diagram of the gate driver 1 with a more detailed representation of the gate control stage 50 and of the latching current circuit 51. According to the representation, the gate-control-stage 50 contains a push-pull stage 52 together with circuit element 53 and the latching current circuit 51 consists of a power FET switch (P-channel FET) 54 for the latching current, of its protective circuit 55 and of a resistor 56 to limit the latching current.

FIG. 5 shows a block diagram of the gate driver 1 with a more detailed representation of the signal evaluation and of the firing and extinguishing pulse logic 36 and 40, respectively (FIG. 3) and the extinguishing pulse lock-out, the firing pulse lock-out and the circuit for the negative gate-cathode voltage during the cut-off phase of the GTO thyristor.

The firing and extinguishing pulse logic 40 contains a number of blocking capacitors 41, a circuit resistor 42 for the optical receiver E, a Schmitt-trigger connected comparator 43, a visual display 44 (LED) of the optical transmission with a circuit resistor, a comparator 45 for the signal evaluation of the latching current, a monostable multivibrator 46 for generating the firing pulse time, an RC timing section 47 for determining the firing pulse duration, a threshold-connected comparator 48 for the signal evaluation for the firing pulse duration and a comparator 79 for activating the push-pull stage 60 for the extinguishing pulse switch 61.

The logical function according to Formula 1 for the firing pulse lock-out is implemented by means of a logical switching element 77 the signal inputs of which are formed by the output signal of the optical receiver E and thus by the optical signal L and by the firing pulse from the monostable multivibrator 46. At the output, the switching element 77 controls the comparator 45 for activating the latching current switch 54 (FIG. 4) and the monostable multivibrator 46 for generating the firing pulse.

The logical function according to Formula 2 for the extinguishing pulse lock-out is implemented by means of a logical switching element 78 the signal inputs of which are formed by the output signal of the optical receiver E and by the negated firing pulse from the monostable multivibrator 46. The output of the switching element 78 controls, on the one hand, the monostable multivibrator 46 for the extinguishing pulse generation and, on the other hand, the comparator 72 for activating the gate-cathode voltage switch 71 which builds up the negative gate-cathode voltage across the gate control connections 6 and 7 of the GTO thyristor. The gate-cathode blocking voltage circuit, finally, is implemented by the activation of the comparator 72 and of the push-pull stage 73 and by the gate-cathode voltage switch 71.

In conclusion, it should also be pointed out that when GTO thyristors are used as frequency converters for ripple control transmitters, six such GTO thyristors with the associated gate drivers are required in each case.

It will be appreciated by those of ordinary skill in the art that the present invention can be embodied in other specific forms without departing from the spirit or essential characteristics thereof. The presently disclosed embodiments are therefore considered in all respects to be illustrative and not restrictive. The scope of the invention is indicated by the appended claims rather than the foregoing description, and all changes that come within the meaning and range of equivalents thereof are intended to be embraced therein.

What is claimed is:

1. Gate control circuit for a GTO thyristor, which can be operated at high cycle frequencies, comprising:
   separate firing and extinguishing circuits;
   separate capacitive charge stores for respectively producing firing and extinguishing current pulses in said separate firing and extinguishing circuits;
   fast switching elements respectively associated with each of said charge stores, said switching elements being directly activated via respective push-pull stages and, when activated, discharging their respective charge stores via the gate-cathode path of the GTO thyristor.

2. Gate control circuit according to claim 1, wherein each of the charge stores for producing the firing and extinguishing current pulses, respectively, is associated with a separate fast switching element, these switching elements preferably being formed by power field-effect transistors.

3. Gate control circuit according to claim 2, wherein the charge stores are connected to a supply which, in order to achieve a high switching frequency of the GTO thyristor, uses at least two, rectified phases of a three-phase system.

4. Gate control circuit according to claim 3, further comprising an additional switching element and a current-limiting resistor arranged in the firing circuit for feeding a control holding current, or latching current, to the gate-cathode path of the thyristor (GTO) during its conducting phase.

5. Gate control circuit according to claim 4, wherein the additional switching element is formed by a power field-effect transistor.

6. Gate control circuit according to claim 5, wherein the power field-effect transistor forming the additional switching element is activated by a push-pull stage.

7. Gate control circuit according to claim 3, wherein the push-pull stage allocated to the fast switching element for the extinguishing current pulses is activated by a first comparator, and the extinguishing circuit includes a second comparator for activating a further push-pull stage which is followed by a gate-cathode voltage switch for maintaining a negative gate-cathode voltage during a cut-off phase of the GTO thyristor.

8. Gate control circuit according to claim 7, wherein a resistor, which is arranged between the gate-cathode voltage switch and the gate of the GTO thyristor, together with a gate-cathode terminating resistor, forms a voltage divider for building up the negative gate-cathode voltage.

9. Gate control circuit according to claim 2, wherein the gate control circuit is activated by an optical signal line, and includes an optical receiving device, which is associated with the optical signal line, for converting received optical signals into electrical signals.

10. Gate control circuit according to claim 9, wherein the optical receiving device is connected to a signal evaluating stage by means of which a firing pulse is triggered when the received signal changes from no light to light and an extinguish pulse is triggered when the signal changes from light to no light.

11. Gate control circuit according to claim 6, wherein a firing pulse i followed by an addition of a latching current and the extinguishing pulse is followed by a build-up of a negative gate-cathode voltage.

12. Gate control circuit according to claim 8, wherein a firing pulse is followed by an addition of a latching current and the extinguishing pulse is followed by a build-up of a negative gate-cathode voltage.

13. Gate control circuit according to claim 10, wherein a firing pulse is followed by an addition of a latching current and the extinguishing pulse is followed by a build-up of a negative gate-cathode voltage 14. Gate control circuit according to claim 9, wherein a circuit for firing pulse lock-out, by means of which any firing pulse present is blocked until a respective extinguishing process has been concluded, includes a logical switching element having signal inputs formed by an output signal of the optical receiving device and by the firing pulse of a firing pulse generator, and the output signal of said logical element being used to control a comparator for activating a switching element for a latching current and the firing pulse generator.

15. Gate control circuit according to claim 9, further comprising a circuit for locking out any extinguishing pulse which may be present, for a duration which corresponds to at least the discharge time constant of a capacitor in a protective circuit of the GTO thyristor, said locking out circuit including a logical switching element having signal inputs which are formed by the output signal of the optical receiving device and by the negated firing pulse of a firing pulse generator, the output signal of said logical switching element being used to control an extinguishing pulse generator and a comparator for activating a gate-cathode voltage switch.

16. Gate control circuit according to claim 14, wherein the firing pulse generator is formed by a monostable multivibrator.

17. Gate control circuit according to claim 15, wherein at least one of said firing pulse generator and said extinghishing pulse generator is formed by a monostable multivibrator.

18. Gate control circuit according to claim 3, wherein preferably three rectified phases of the three-phase system are used by said supply.

19. Gate control circuit according to claim 9, wherein the optical signal line comprises an optical fiber.

* * * * *